United States Patent
Tardieu et al.

(10) Patent No.: US 6,806,735 B2
(45) Date of Patent: Oct. 19, 2004

(54) BUFFER FOR CONTACT CIRCUIT

(75) Inventors: Olivier Tardieu, Marseilles (FR); Christophe Moreaux, Eguilles (FR); Ahmed Kari, Aix En Provence (FR)

(73) Assignee: STMicroelectronics SA, Montrouge (FR)

( * ) Notice: Subject to any disclaimer, the term of this patent is extended or adjusted under 35 U.S.C. 154(b) by 0 days.

(21) Appl. No.: 10/436,881

(22) Filed: May 13, 2003

(65) Prior Publication Data

US 2003/0216088 A1 Nov. 20, 2003

(30) Foreign Application Priority Data

May 14, 2002 (FR) .......................................... 02 05879

(51) Int. Cl.[7] ........................................ H03K 19/0175
(52) U.S. Cl. ............................. 326/81; 326/83; 326/58
(58) Field of Search ............................. 326/56–58, 80, 326/81, 82, 83, 86

(56) References Cited

U.S. PATENT DOCUMENTS

| | | | |
|---|---|---|---|
| 4,883,988 A | 11/1989 | Ide et al. ................... | 307/443 |
| 5,019,727 A | 5/1991 | Kusaba ....................... | 307/449 |
| 5,748,024 A | 5/1998 | Takahashi et al. .......... | 327/333 |
| 5,804,998 A | 9/1998 | Cahill et al. ................ | 327/108 |
| 6,087,852 A * | 7/2000 | Briggs et al. ................. | 326/68 |
| 6,118,301 A * | 9/2000 | Singh et al. .................. | 326/58 |
| 6,239,617 B1 * | 5/2001 | Guertin et al. ................ | 326/81 |
| 6,278,294 B1 * | 8/2001 | Taniguchi .................... | 326/80 |
| 6,724,222 B2 * | 4/2004 | Patel et al. .................... | 326/80 |

* cited by examiner

Primary Examiner—Don Le
(74) Attorney, Agent, or Firm—Allen, Dyer, Doppelt Milbrath & Gilchrist, P.A.; Lisa K. Jorgenson

(57) ABSTRACT

A buffer of reduced size includes a logic gate to raise the potential level of input digital data having a first logic level to a potential equal to a low power supply potential, and to produce intermediate data if a validation signal is active. The buffer also includes a tristate inverter to produce output data, at an output, that are logically inverse to the intermediate data if the validation signal is active and having its output at high impedance if otherwise. Such a buffer is particularly useful as an output buffer for contact cards using a power supply potential different from a potential powering a reader with which the card communicates.

23 Claims, 2 Drawing Sheets

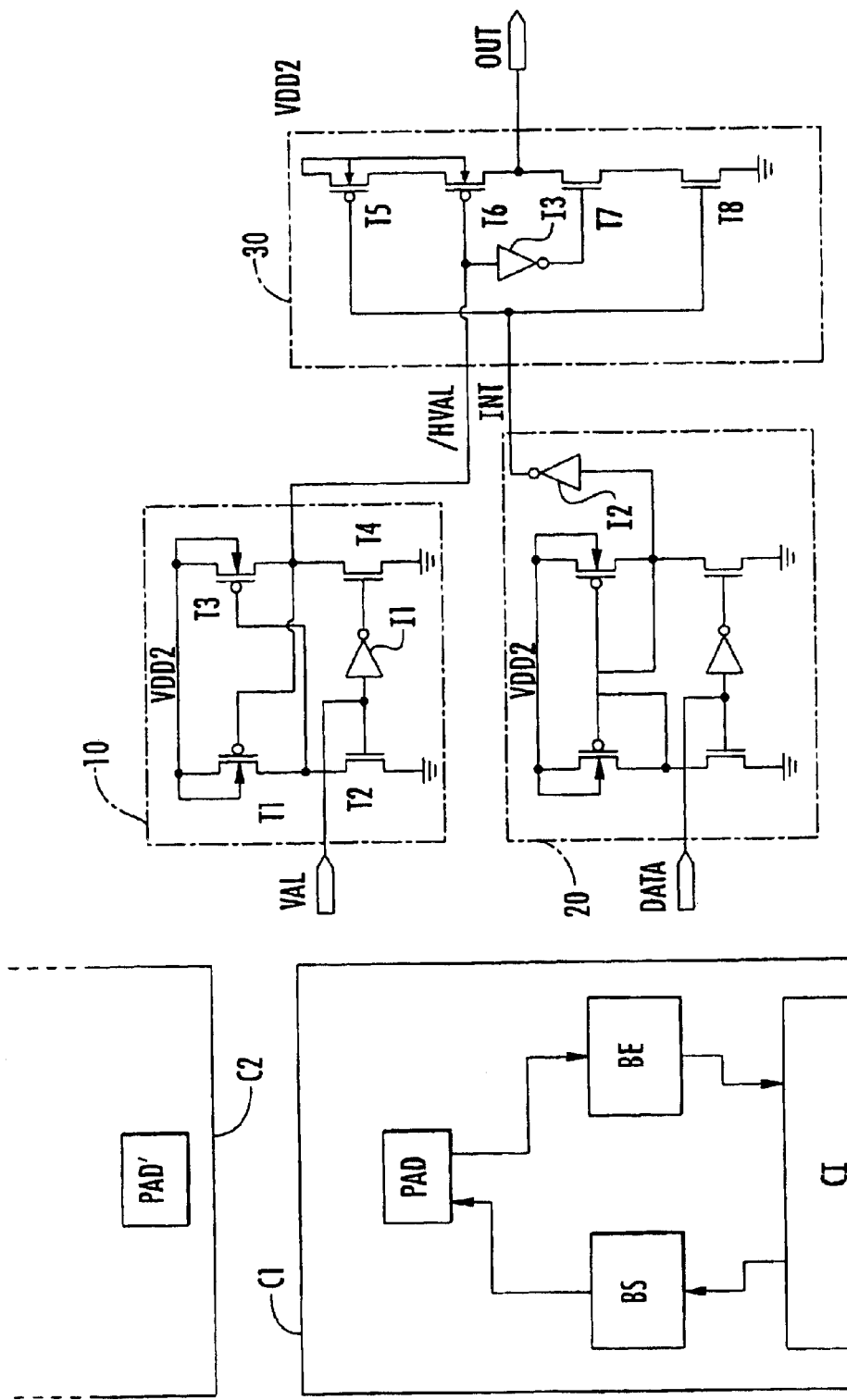

US 6,806,735 B2

BUFFER FOR CONTACT CIRCUIT

FIELD OF THE INVENTION

The invention relates to a buffer, for example for a contact card. The invention is particularly related to a contact card using a power supply potential VDD1 different from a power supply potential VDD2 used by a reader with which the card communicates.

BACKGROUND OF THE INVENTION

A contact card C1 (FIG. 1) generally comprises an integrated circuit CI grouping together all the electronic circuits capable of performing all the functions of the card. The circuit CI is connected to at least one contact pad or terminal PAD. When the card is used, the contact terminal/terminals of the card come into contact with one of the corresponding terminals of the card reader into which the card is inserted. A pad or terminal PAD can be used as input terminal for the circuit CI to receive data coming from the reader C2 or as output terminal so that the circuit CI can transmit data to the reader. A same terminal PAD can also be used as input terminal for certain functions of the circuit CI and as output for other functions of the circuit CI.

When the card power supply potential VDD1 is different from the reader power supply potential VDD2, then an input and/or output buffer has to be used between the terminal PAD and the circuit CI of the card to adapt the amplitude of the signals. An input buffer BE thus has the function of converting signals received from the reader, which range from 0 to VDD2, into signals ranging from 0 to VDD1 that can be exploited by the circuit CI. Similarly, an output buffer BS has the function of converting signals to be transmitted to the reader and ranging from 0 to VDD1 into signals ranging from 0 to VDD2 that are exploitable by the card reader.

When a terminal PAD is used as input and output, the input and output buffers should not disturb each other at the common point at the terminal PAD. To this end, in particular, the output buffer BS should have a high impedance output when it is not used. In one example, we consider a card powered by an internal power supply potential VDD1 powering the card. This potential VDD1 is lower than the potential VDD2 powering the reader. The internal power supply potential VDD1 powering the card is produced, by a known regulation circuit, from the potential VDD2 received at an input of the card. An input buffer for a card of this kind is made according to known approaches using, in particular, inverters supplied with the potential VDD1. An output buffer for a card of this kind is shown in FIG. 2. It includes two potential step-up circuits 10, 20 and one tristate inverter 30.

The potential step-up circuit 10 receives a logic control signal VAL that takes either of two values, 0 or VDD1, and it produces a logic signal HVAL of a higher level, taking two values:

HVAL=0 when VAL=0

HVAL=VDD2 when VAL=VDD1.

In the example of FIG. 2, the potential step-up circuit 10 comprises two P type transistors T1, T3, two N type transistors T2, T4, and one simple inverter I1 powered by VDD1. The transistors T1, T2 are series-connected. The potential VDD2 is applied to the source and the well of T1 and the source of T2 is connected to a ground of the circuit. The common drain of the transistors T1, T2 is connected to the gate of T3. The transistors T3, T4 are also series-connected. The potential VDD2 is applied to the source and the well of T3, and the source of T4 is connected to the ground of the circuit. The common drain of the transistors T3, T4 is connected to the gate of T1 and forms the output of the potential step-up circuit 10 at which the signal HVAL is produced. Finally the gate of T2 is connected to the gate of T4 via the inverter I1. The gate of T2 forms the input of the step-up circuit to which the signal VAL is applied.

The step-up circuit 20 receives a logic signal DATA, taking either of two values, 0 or VDD1, and it produces a logic signal INT that is the inverse of the signal DATA but has a higher level. The signal INT thus takes two values:

INT=VDD2 when DATA=0

INT=0 when DATA=VDD1.

The step-up circuit 20 is made in the same way as the step-up circuit 10; a simple inverter I2 powered by the potential VDD2 has simply been added to the output of the step-up circuit 20. The inverter 30 receives the validation signal HVAL and the data signal INT, which take either of two values, 0 or VDD2. The inverter 30 has an output terminal OUT connected to the terminal PAD of the card. The inverter 30 works as follows: it produces a logic signal HDATA that is the inverse of INT, e.g. the same logic value as DATA, at the output OUT when the signal HVAL is active (in the example equal to 0); its output OUT is at high impedance when the signal HVAL is inactive.

The inverter 30 has two P type transistors T5, T6, two N type transistors T7, T8 and one simple inverter I3. The transistors T5, T6, T7, T8 are series-connected between a ground of the circuit and a power supply terminal to which the potential VDD2 is applied. The potential VDD2 is applied to the wells of the transistors T5, T6 and to the source of the transistor T5 whose drain is connected to the source of T6. The source of T8 is connected to the ground of the circuit and its drain is connected to the source of T7. The drains of the transistors T6, T7 are connected together to the output OUT of the inverter 30. The gates of the transistors T5, T8 are connected together and receive the signal INT. Finally, the gate of T6 is connected to the gate of T7 via the inverter I3 powered by VDD2. The gate of T6 receives the control signal HVAL.

The inverter 30 works as follows. When HVAL=VDD2, the transistors T6, T7 are off and the output OUT is at high impedance, whatever the value of INT and whatever the state of the transistors T5, T8. Conversely, when HVAL=0, the transistors T6, T7 are on. Depending on the value of the signal INT, the transistor T5 or the transistor T8 is on and the logic signal HDATA, which is the inverse of the signal INT, is produced at the output OUT. The signal HDATA is finally identical to the signal DATA from a logic point of view, but is at a higher potential level. It must be noted that the signals HVAL and INT must necessarily reach the value VDD2 to turn off the operation of the inverter 30, and more specifically to turn off the transistor T6, whence the necessity of using the potential step-up circuits 10, 20.

The buffer of FIG. 2 has the drawback of using a large number of transistors. Indeed, given that a simple inverter (like I1, I2 or I3) is made from a P type transistor and an N type transistor that are series-connected, it is necessary to use a total of 20 transistors to make the buffer. The fact that the number of transistors is large naturally entails a large-sized circuit, and also substantial power consumption.

SUMMARY OF THE INVENTION

It is an object of the invention to make a buffer with a reduced number of transistors, to make a buffer that is smaller-sized and consumes less power than the prior art buffers having the same function.

This and other objects are attained by a buffer according to the invention that includes a logic gate to raise the potential level of input digital data having a first logic level ("1") to a potential equal to a low power supply potential (VDD1), and to produce intermediate data if a validation signal is active. The intermediate data has a first logic level ("1") whose potential is equal to a high power supply potential (VDD2), and the intermediate data is logically inverse to the input data. The buffer also includes a tristate inverter to produce output data, at an output, that are logically inverse to the intermediate data if the validation signal is active and having its output OUT at high impedance if this is not the case.

A buffer according to the invention has the same function as a prior art equivalent buffer: at its output, it produces data which, from a logic point of view, is identical to the data that it receives at its input but has a different potential level. However, the buffer according to the invention uses only one potential step-up logic gate and therefore uses a far smaller number of transistors than a prior art buffer, and shall be seen more clearly here below in examples.

BRIEF DESCRIPTION OF THE DRAWINGS

The invention and the advantages that flow from it shall appear more clearly from the following description of exemplary embodiments of a buffer according to the invention. The description must be read with reference to the appended drawings, of which:

FIG. 1, which has already been described, is a schematic drawing of a typical contact card;

FIG. 2, already described, is an schematic diagram of a prior art buffer; and

DETAILED DESCRIPTION OF THE PREFERRED EMBODIMENTS

Figure 3:
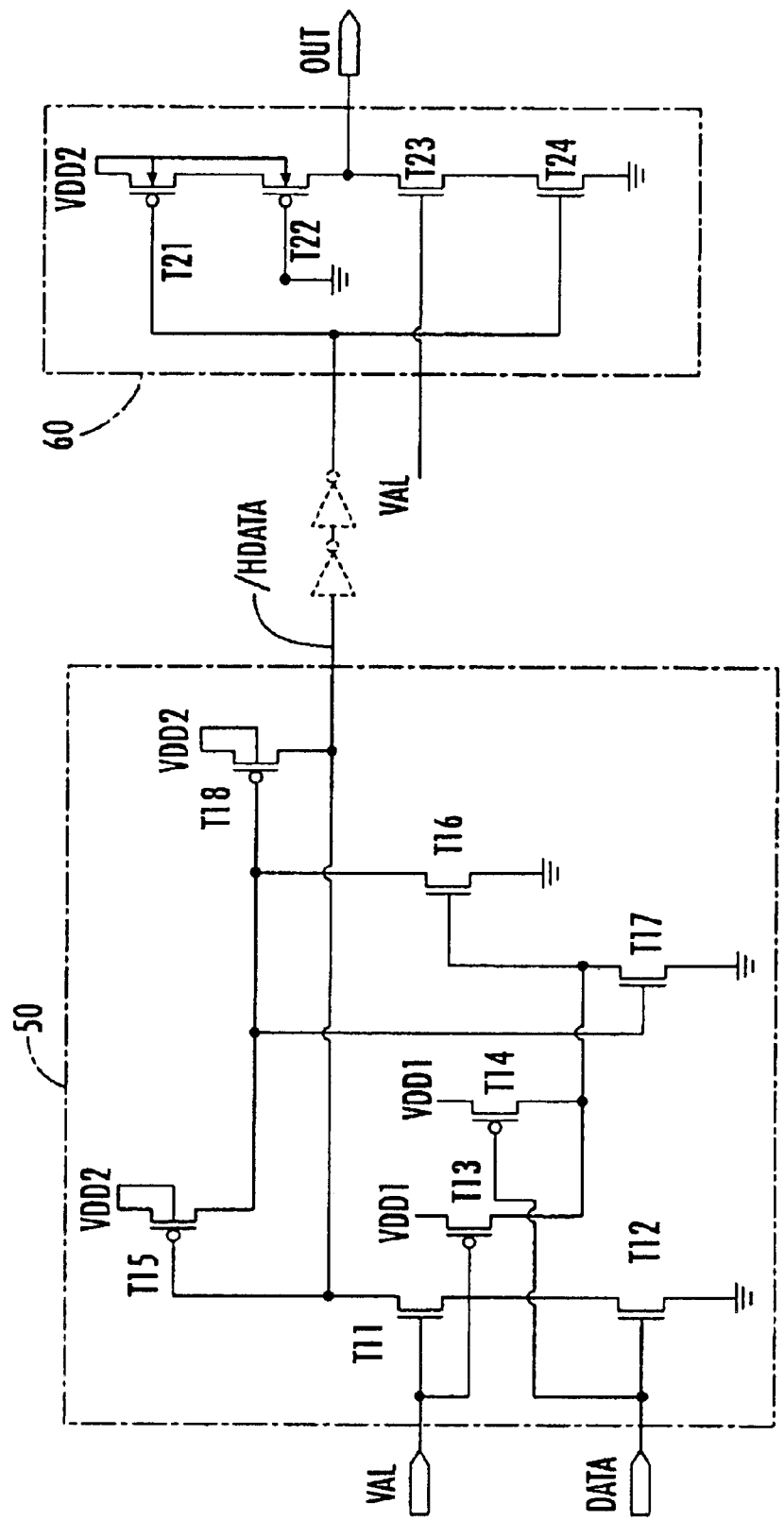
FIG. 3 is an schematic diagram of a buffer according to the present invention.

A buffer according to the invention may be used, for example, in a card such as that of FIG. 1, as an output buffer BS between the circuit CI and a terminal PAD of the card. The terminal PAD is used in the example as an input terminal during normal operation of the card and as an output terminal during a phase of testing of the card. The integrated circuit CI of the card uses a low power supply potential VDD1, for example equal to 3 V. The buffer is used to transmit data to a circuit (for example a card reader) using a high-power supply potential VDD2, equal for example to 5 V.

The buffer receives digital data DATA in the form of a logic signal taking either of two logic values, 0 or VDD1, and a validation logic signal VAL also taking either of two values, 0 or VDD1. The buffer raises the potential of the data DATA and then, when the signal VAL is active, it produces a logic signal HDATA containing the data DATA at an output OUT. The signal HDATA varies between 0 and VDD2 which is greater than VDD1. When the signal VAL is inactive, the output OUT of the buffer is at high impedance. Thus, the buffer does not disturb its environment when it is inactive (here in the normal mode of operation of the card).

The buffer comprises a potential step-up logic gate 50 and a tristate inverter 60. The logic gate 50 is a NAND type logic gate, comprising four N type transistors T11, T12, T16, T17 and four P type transistors T13, T14, T15, T18. The drain of the transistor T11 is connected to the gate of the transistor T15 and the source of T11 is connected to the drain of the transistor T12 whose source is ground-connected. The potential VDD2 is applied to the source and the well of the transistor T15 and to the source and the well of the transistor T18. The drain of T15 is connected to the gate of T18. The potential VDD1 is applied to the source of the transistors T13, T14. The drain of T13 and the drain of T14 are connected together to the gate of the transistor T16 and to the drain of the transistor T17. The source of T16 and the source of T17 are ground-connected. The drain of T16 and the gate of T17 are connected together to the drain of T15 and to the gate of T18. Finally, the gate of T11 and the gate of T13 are connected together to an input terminal of the logic gate 50 to which the signal VAL is applied. The gate of T12 and the gate of T14 are connected together to another input terminal of the logic gate 50 to which the signal DATA is applied. The drain of T11 and the drain of T18 are connected together to an output terminal of the logic gate 50 at which a signal /HDATA is produced.

The logic gate 50 works as follows. When the signal VAL is inactive at 0, T11 is off and T13 is on; the potential VDD1 appears at the drain of T13 and at the gate of T16, thus turning the transistor T16 on. The zero potential then appears at the drain of the transistor T16 and at the gate of T18. T18 is thus turned on and the signal /HDATA at its drain is equal to VDD2.

When the signal VAL is active, and equal to VDD1 corresponding to a logic "1", the transistor T11 is on and the transistor T13 is off. When the signal DATA is equal to 0, T12 is off and T14 is on; the potential VDD1 appears at the drain of T14 and at the gate of T16; the transistor T16 is on, the zero potential appears at the drain of T16 and therefore at the gate of T18; the transistor T18 is on and the signal /HDATA at the drain of T18 is equal to VDD2. Conversely, when the signal DATA is equal to VDD1, T12 is on and T14 is off; the zero potential appears at the drain of T12 and then at the drain of T11 and at the gate of T15; T15 is on and the potential VDD2 appears at the drain of T15 and at the gate of T18 which is off; the signal /HDATA is equal to 0.

In short, the logic gate 50 receives the signals VAL and DATA ranging from 0 to VDD1 and it produces a signal /HDATA which is:

/HDATA = VDD2 when VAL is inactive at 0,
/HDATA = 0 if DATA = VDD1 and VAL is active at VDD1,
/HDATA = VDD2 if DATA = 0 and VAL is active at VDD1.

The tristate inverter 60 comprises two P type transistors T21, T22 and two N type transistors T23, T24 connected in series. The potential VDD2 is applied to the source of the transistor T21 whose drain is connected to the source of T22. The potential VDD2 is also applied to the wells of the transistors T21, T22. The ground of the circuit is connected to the source of the transistor T24 whose drain is connected to the source of T23. The drains of the transistors T22, T23 are connected together to an output terminal OUT of the inverter. The gate of T22 is ground-connected and the validation signal VAL is applied to the gate of the transistor T23. Finally, the signal /HDATA containing the intermediate data is applied to the gates of the transistors T21, T24.

The inverter 60 works as follows. When the signal VAL is inactive and equal to 0, the signal /HDATA is equal to VDD2; the transistors T21 and T23 of the inverter are therefore off and OUT is at high impedance. When the signal VAL is active and equal to VDD1 (corresponding to a logic "1"), the transistors T22, T23 are on. In this case, the inverter produces the signal HDATA at its output OUT. This signal is the inverse of the signal /HDATA. The value of /HDATA varies according to whether it is the transistor T21 or the transistor T24 that is on.

It will be noted that, according to the diagram of FIG. 3, the buffer according to the invention comprises 12 transistors only, giving a gain of about 40% as compared with a known buffer, in terms of silicon surface area and power consumed.

If the capacitive charge at the output OUT of the inverter 60 is great, then substantial current has to be given to the transistors T21, T24 so that the inverter 60 can switch over without difficulty. For this purpose, it is possible to add two simple inverters (shown in dashes in FIG. 3) powered by the potential VDD2 and series-connected between the gate 50 and the inverter 60. The buffer then becomes slightly bigger (16 transistors), but nevertheless remains smaller than the prior art buffers.

That which is claimed is:

1. An integrated circuit comprising a buffer comprising:
    a logic gate to raise the potential level of input digital data having a first logic level to a potential equal to a low power supply potential, and to produce intermediate data when a validation signal is active, the intermediate data having a first logic level with a potential equal to a high power supply potential, the intermediate data being logically inverse to the input digital data; and
    a tristate inverter to produce output data, at an output, that is logically inverse to the intermediate data when the validation signal is active and having its output at high impedance when the validation signal is not active.

2. A circuit according to claim 1, wherein the buffer further comprises two inverters series-connected between the logic gate at which the intermediate data is produced and the tristate inverter.

3. An integrated circuit according to claim 1, wherein the logic gate comprises a potential step-up NAND logic gate.

4. An integrated circuit according to claim 3, wherein the logic gate comprises:
    first, second and third transistors, the first transistor and the second transistor being series-connected between a reference potential and a gate of the third transistor, the high power supply potential being applied to the source of the third transistor, a gate of the first transistor being connected to a first input of the logic gate to which the validation signal is applied, and a gate of the second transistor being connected to a second input of the logic gate to which the input digital data is applied;
    fourth, fifth and sixth transistors, the fourth transistor and fifth transistor being parallel-connected between the low power supply potential and a drain of the sixth transistor a source of which is connected to the reference potential and a gate of which is connected to a drain of the third transistor, a gate of the fourth transistor being connected to the first input of the logic gate and a gate of the fifth transistor being connected to the second input of the logic gate;
    a seventh transistor having a gate connected to the drain of the sixth transistor, a source connected to the reference potential and a drain connected to the drain of the third transistor; and
    an eighth transistor having a gate connected to the drain of the third transistor and a drain connected to the gate of the third transistor, the high power supply potential being applied to a source of the eighth transistor and the drain of the eighth transistor forming an output of the logic gate at which the intermediate data is produced.

5. An integrated circuit according to claim 1, wherein the tristate inverter comprises:
    a ninth transistor, a tenth transistor, an eleventh transistor and a twelfth transistor connected in series, the high power supply potential being applied to the source of the ninth transistor, a drain of the ninth transistor being connected to a source of the tenth transistor, a source and a drain of the twelfth transistor being connected respectively to the reference potential and to a source of the eleventh transistor, a common drain of the tenth transistor and of the eleventh transistor defining the output of the tristate inverter, a gate of the tenth transistor being connected to the reference potential, a common gate of the ninth transistor and of the twelfth transistor forming an input of the tristate inverter to which the intermediate data is applied, and a gate of the eleventh transistor forming a validation input of the tristate inverter to which the validation signal is applied.

6. A buffer for an integrated circuit comprising:
    a logic gate for receiving an input data signal and a validation signal, and to raise the potential level of the input data signal having a first logic level to a potential equal to a first power supply potential, and to produce an intermediate data signal when the validation signal is active, the intermediate data signal having a first logic level with a potential equal to a second power supply potential, the intermediate data signal being logically inverse to the input data signal; and
    a tristate inverter to produce an output data signal, at an output, that is logically inverse to the intermediate data signal when the validation signal is active.

7. A buffer according to claim 6, wherein the tristate inverter has its output at high impedance when the validation signal is not active.

8. A buffer according to claim 6, further comprising two inverters series-connected between the logic gate and the tristate inverter.

9. A buffer according to claim 6, wherein the logic gate comprises a potential step-up NAND logic gate.

10. A buffer according to claim 9, wherein the logic gate comprises:
    first, second and third transistors, the first transistor and the second transistor being series-connected between a reference potential and a gate of the third transistor, the second power supply potential being applied to the source of the third transistor, a gate of the first transistor being connected to a first input of the logic gate to which the validation signal is applied, and a gate of the second transistor being connected to a second input of the logic gate to which the input data signal is applied;
    fourth, fifth and sixth transistors, the fourth transistor and fifth transistor being parallel-connected between the first power supply potential and a drain of the sixth transistor a source of which is connected to the reference potential and a gate of which is connected to a drain of the third transistor, a gate of the fourth transistor being connected to the first input of the logic gate and a gate of the fifth transistor being connected to the second input of the logic gate;
    a seventh transistor having a gate connected to the drain of the sixth transistor, a source connected to the reference potential and a drain connected to the drain of the third transistor; and an eighth transistor having a gate connected to the drain of the third transistor and a drain connected to the gate of the third transistor, the second power supply potential being applied to a source of the eighth transistor and the drain of the eighth transistor forming an output of the logic gate at which the intermediate data signal is produced.

11. A buffer according to claim 6, wherein the tristate inverter comprises:

a ninth transistor, a tenth transistor, an eleventh transistor and a twelfth transistor connected in series, the second power supply potential being applied to the source of the ninth transistor, a drain of the ninth transistor being connected to a source of the tenth transistor, a source and a drain of the twelfth transistor being connected respectively to the reference potential and to a source of the eleventh transistor, the tenth transistor and the eleventh transistor having a common drain defining the output of the tristate inverter, a gate of the tenth transistor being connected to the reference potential, the ninth transistor and the twelfth transistor having a common gate forming an input of the tristate inverter to which the intermediate data is applied, and a gate of the eleventh transistor forming a validation input of the tristate inverter to which the validation signal is applied.

12. A contact card comprising:

a controller;

a contact terminal;

an input buffer connected between the controller and the contact terminal; and an output buffer connected between the controller and the contact terminal, the output buffer comprising a logic gate for receiving an input data signal and a validation signal from the controller, and to raise the potential level of the input data signal having a first logic level to a potential equal to a first power supply potential, and to produce an intermediate data signal when the validation signal is active, the intermediate data signal having a first logic level with a potential equal to a second power supply potential, the intermediate data signal being logically inverse to the input data signal, and a tristate inverter to produce an output data signal, at an output, that is logically inverse to the intermediate data signal when the validation signal is active.

13. A contact card according to claim 12, wherein the tristate inverter has its output at high impedance when the validation signal is not active.

14. A contact card according to claim 12, further comprising two inverters series-connected between the logic gate and the tristate inverter.

15. A contact card according to claim 12, wherein the logic gate comprises a potential step-up NAND logic gate.

16. A contact card according to claim 15, wherein the logic gate comprises:

first, second and third transistors, the first transistor and the second transistor being series-connected between a reference potential and a gate of the third transistor, the second power supply potential being applied to the source of the third transistor, a gate of the first transistor being connected to a first input of the logic gate to which the validation signal is applied, and a gate of the second transistor being connected to a second input of the logic gate to which the input data signal is applied;

fourth, fifth and sixth transistors, the fourth transistor and fifth transistor being parallel-connected between the first power supply potential and a drain of the sixth transistor a source of which is connected to the reference potential and a gate of which is connected to a drain of the third transistor, a gate of the fourth transistor being connected to the first input of the logic gate and a gate of the fifth transistor being connected to the second input of the logic gate;

a seventh transistor having a gate connected to the drain of the sixth transistor, a source connected to the reference potential and a drain connected to the drain of the third transistor; and an eighth transistor having a gate connected to the drain of the third transistor and a drain connected to the gate of the third transistor, the second power supply potential being applied to a source of the eighth transistor and the drain of the eighth transistor forming an output of the logic gate at which the intermediate data signal is produced.

17. A contact card according to claim 12, wherein the tristate inverter comprises:

a ninth transistor, a tenth transistor, an eleventh transistor and a twelfth transistor connected in series, the second power supply potential being applied to the source of the ninth transistor, a drain of the ninth transistor being connected to a source of the tenth transistor, a source and a drain of the twelfth transistor being connected respectively to the reference potential and to a source of the eleventh transistor, the tenth transistor and the eleventh transistor having a common drain defining the output of the tristate inverter, a gate of the tenth transistor being connected to the reference potential, the ninth transistor and the twelfth transistor having a common gate forming an input of the tristate inverter to which the intermediate data is applied, and a gate of the eleventh transistor forming a validation input of the tristate inverter to which the validation signal is applied.

18. A method of operating a buffer for an integrated circuit comprising:

raising the potential level of an input data signal having a first logic level to a potential equal to a first power supply potential with a logic gate;

producing an intermediate data signal when a validation signal received at the logic gate is active, the intermediate data signal having a first logic level with a potential equal to a second power supply potential, the intermediate data signal being logically inverse to the input data signal; and producing an output data signal, with a tristate inverter, that is logically inverse to the intermediate data signal when the validation signal is active.

19. A method according to claim 18, wherein the tristate inverter has its output at high impedance when the validation signal is not active.

20. A method according to claim 18, further comprising series-connecting two inverters between the logic gate and the tristate inverter.

21. A method according to claim 18, wherein the logic gate comprises a potential step-up NAND logic gate.

22. A method according to claim 21, wherein the logic gate comprises:

first, second and third transistors, the first transistor and the second transistor being series-connected between a reference potential and a gate of the third transistor, the second power supply potential being applied to the source of the third transistor, a gate of the first transistor being connected to a first input of the logic gate to which the validation signal is applied, and a gate of the second transistor being connected to a second input of the logic gate to which the input data signal is applied;

fourth, fifth and sixth transistors, the fourth transistor and fifth transistor being parallel-connected between the first power supply potential and a drain of the sixth transistor a source of which is connected to the reference potential and a gate of which is connected to a drain of the third transistor, a gate of the fourth transistor being connected to the first input of the logic gate and a gate of the fifth transistor being connected to the second input of the logic gate;

a seventh transistor having a gate connected to the drain of the sixth transistor, a source connected to the reference potential and a drain connected to the drain of the third transistor; and an eighth transistor having a gate connected to the drain of the third transistor and a drain connected to the gate of the third transistor, the second power supply potential being applied to a source of the eighth transistor and the drain of the eighth transistor forming an output of the logic gate at which the intermediate data signal is produced.

23. A method according to claim 18, wherein the tristate inverter comprises:

a ninth transistor, a tenth transistor, an eleventh transistor and a twelfth transistor connected in series, the second power supply potential being applied to the source of the ninth transistor, a drain of the ninth transistor being connected to a source of the tenth transistor, a source and a drain of the twelfth transistor being connected respectively to the reference potential and to a source of the eleventh transistor, the tenth transistor and the eleventh transistor having a common drain defining the output of the tristate inverter, a gate of the tenth transistor being connected to the reference potential, the ninth transistor and the twelfth transistor having a common gate forming an input of the tristate inverter to which the intermediate data is applied, and a gate of the eleventh transistor forming a validation input of the tristate inverter to which the validation signal is applied.

* * * * *